June 4, 1963 C. H. KNOWLES ET AL 3,092,522

METHOD AND APPARATUS FOR USE IN THE MANUFACTURE OF TRANSISTORS

Filed April 27, 1960 3 Sheets-Sheet 1

ACTUAL SIZE

INVENTORS
Carl Harry Knowles,
Harry da Costa,
By Mueller & Aichele
Att'ys.

June 4, 1963 C. H. KNOWLES ET AL 3,092,522

METHOD AND APPARATUS FOR USE IN THE MANUFACTURE OF TRANSISTORS

Filed April 27, 1960 3 Sheets-Sheet 2

INVENTORS.
Carl Harry Knowles,
Harry da Costa,
By Mueller & Aichele Att'ys.

INVENTORS.
Carl Harry Knowles
Harry da Costa,
By Mueller & Aichele Attys.

United States Patent Office 3,092,522
Patented June 4, 1963

3,092,522

METHOD AND APPARATUS FOR USE IN THE MANUFACTURE OF TRANSISTORS

Carl Harry Knowles, Scottsdale, and Harry Da Costa, Phoenix, Ariz., assignors to Motorola, Inc., Chicago, Ill., a corporation of Illinois Filed Apr. 27, 1960, Ser. No. 25,084
1 Claim. (Cl. 148—1.5)

This invention relates generally to methods and apparatus for use in the manufacture of semiconductor devices. More particularly, the invention is directed to a method and apparatus for treating a semiconductor wafer so as to form a diffused base region and a collector junction within the wafer and many small-area emitter and base contacts arranged in pairs on the wafer, such that the wafer can be divided to provide a large number of semiconductor units for high frequency transistors.

In a particularly successful construction for diffused-base transistors, the device includes a tiny semiconductor die unit having an active central portion which is defined by a surrounding depressed area. This central portion includes the active diffused base region and the active collector junction of the transistor, and the main part of the die serves as a collector region. A pair of vapor-deposited contacts are located on the active central portion of the die, and one of these contacts forms an emitter junction with the base region and the other contact is in ohmic connection with the base region.

The die units are formed by dicing or dividing larger wafers or slabs of simiconductor material which are fabricated so that a large number of die units can be obtained from each wafer. A diffused base region and collector junction are formed within each wafer by heating the wafer while it is in contact with a vapor which contains conductivity-modifying impurity material. The impurity material penetrates into the wafer forming a very thin diffused layer, and the diffused layer and the substrate are of opposite conductivity type so that a rectifying junction is formed between them. Many pairs of emitter and base contacts are formed on each diffused wafer by evaporation of metallic material in vacuum evaporator apparatus through a patterned mask onto the diffused layer of the wafer, and by alloying of the deposits with the wafer so that each emitter contact forms a rectifying junction and each base contact forms an ohmic connection with the diffused layer. The wafer is later divided into many individual die units, each of which has an emitter contact and a base contact on it.

It has been difficult to deposit the metallic materials for the emitter and base contacts and alloy the materials with the diffused layer in a manner which results in high yields of mechanically and electrically satisfactory units. One of the problems is that it is necessary to control accurately the penetration of the emitter junction into the diffused layer because the junction penetration determines the base width in the completed units, and this is a critical factor in determining the high frequency properties of the completed transistors. The amount of junction penetration also affects various low frequency and D.C. parameters such as breakdown voltage and beta. The alloy regions of both the emitter and base contacts must be limited to a penetration less than the thickness of the diffused layer in order to avoid shorting through the base region.

In order to achieve accurate control over penetration of the alloy regions, it has been necessary to first deposit the material for the emitter contacts on the wafer in the vacuum evaporator, then heat the wafer in the evaporator to a specific temperature so as to alloy the deposited material with the wafer, and then cool the wafer. Subsequently, the base contacts have been deposited and alloyed in a similar manner. The deposition and alloying of the contacts in a single cycle has been found to be so time consuming as to hold down the output of completed wafers, and the yield of mechanically and electrically satisfactory wafers in the output has been undesirably low.

It is one object of the present invention to provide a method for producing semiconductor units which have a diffused collector junction, a vapor deposited and alloyed emitter contact, and a vapor deposited and alloyed base contact, which method lends itself to mass production of the units with a high yield of commercially acceptable units.

Another object of the invention is to provide an improved method for forming a plurality of base contacts and emitter contacts arranged in pairs on a semiconductor wafer, by vacuum deposition of vapor material through openings in a mask onto the wafer and alloying of the deposited material with a thin diffused layer of the wafer in a manner which achieves accurately controlled penetration of the alloy regions.

A feature of the invention is the provision of a method for producing semiconductor units for high frequency transistors by diffusing impurities into one or more doped semiconductor wafers so as to form a diffused junction in each of them, vapor depositing metallic material onto selected portions of the wafers in a vacuum chamber, heating the wafers in an alloying furnace so that the vapor deposited materials alloy with the wafers and form emitter junctions and base contacts, and subsequently dividing the wafers up into many individual die units which, in an incomplete form, are the semiconductor units for many transistors. Each of these steps can be controlled very accurately so that the resulting semiconductor units are sufficiently uniform, both structurally and electrically, as to provide a high output of commercially satisfactory units.

Another feature of the invention is a method for providing junctions and contacts for a slab or wafer of doped semiconductor material by vapor depositing selected materials onto the wafer in a vacuum chamber with the wafer maintained at a substantially constant temperature, and then removing the wafer from the vacuum chamber and heating it in an alloying furnace at a carefully controlled elevated temperature so as to alloy the vapor deposited materials with the wafer. Excellent control is achieved over the amounts of materials which are deposited and the depth of penetration of these materials during the alloying, largely because the vapor deposition and alloying are carried out in separate steps, and there is no need to vary the temperature of the wafer during either the deposition step or the alloying step.

The invention will be described with reference to the accompanying drawings in which.

Figures 6, 7, 8, 9:
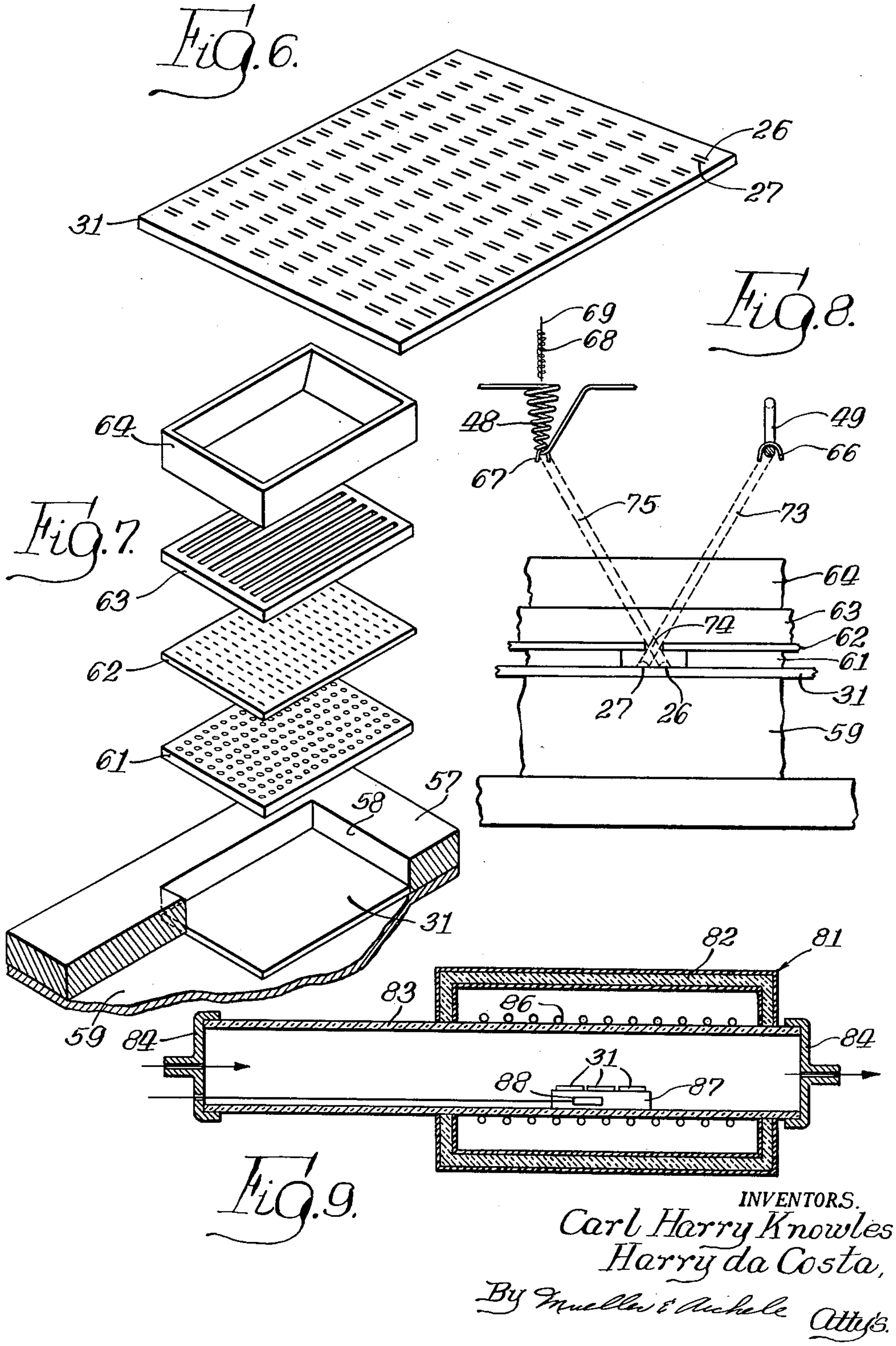
FIG. 6 is an enlarged view of a germanium wafer which has many pairs of emitter and base contacts on its surface, and these contacts are deposited on the wafer in the vacuum evaporator apparatus of FIG. 4.
FIG. 7 is an exploded view which illustrates the way in which a mask and certain other elements are assembled with the wafer of FIG. 6 prior to deposition of the contacts in the apparatus of FIG. 4.

FIG. 8 is a schematic fragmentary view which shows the assembled relation of the parts illustrated in FIG. 6, and which also shows the relation of the assemblage to a pair of vaporizing filaments provided in the vacuum evaporator apparatus; and FIG. 9 is a somewhat schematic cross-sectional view of an alloying furnace in which the wafer of FIG. 6 is heated so as to cause the deposits on its surface to alloy with the wafer and form emitter junctions and ohmic connections.

Figure 3:
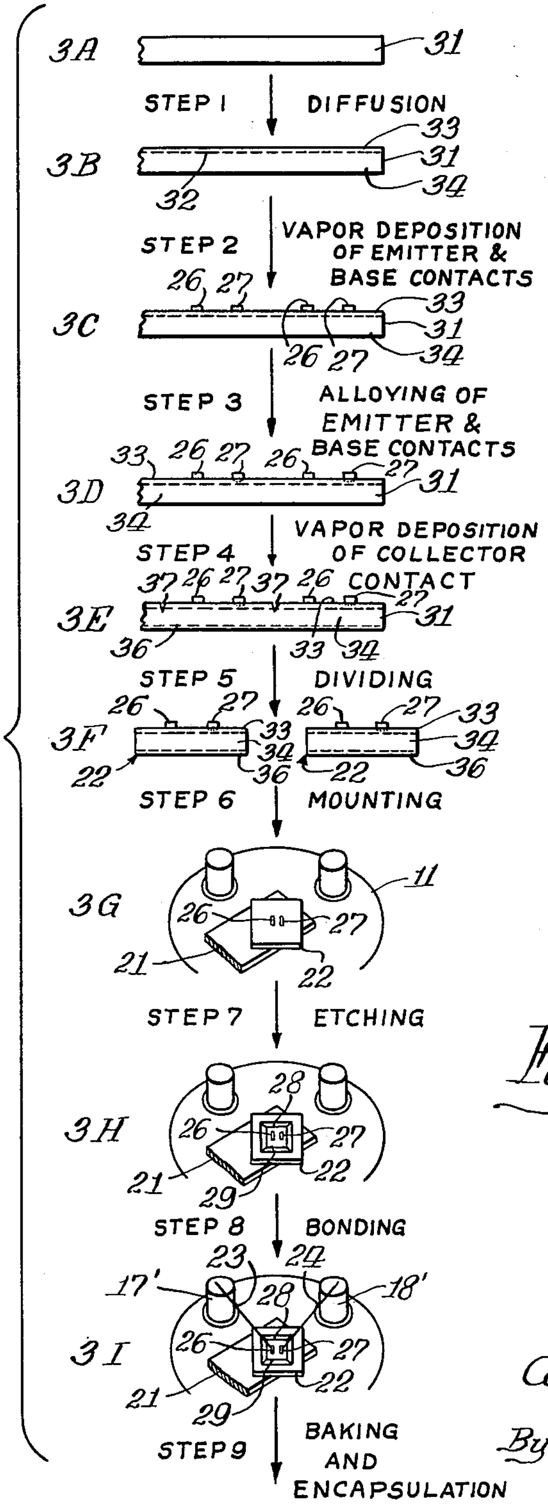
FIG. 3 is a flow diagram illustrating the main steps of a process for fabricating the transistor of FIGS. 1 and 2.
Figure 1:
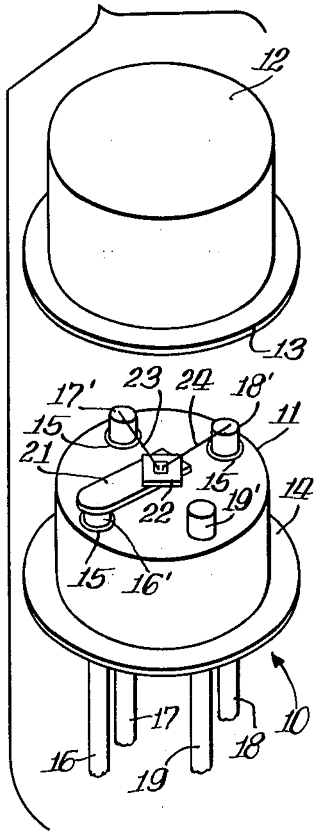
FIG. 1 is a perspective view of a transistor which is the end product of the manufacturing process described herein, and this view is greatly enlarged and shows the outer cover of the transistor removed so as to illustrate the internal construction.
Figure 2:
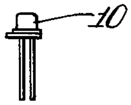
FIG. 2 is a view of the transistor of FIG. 1 with the cover assembled, and this view shows the actual size of a typical unit.

The method of the invention is practiced in the manufacture of semiconductor devices such as high frequency transistors. A high frequency transistor of the diffused-base type is illustrated in FIGS. 1 and 2, and the main steps of a manufacturing process for making this transistor are shown in FIG. 3. The transistor 10 includes a mounting header 11 and a cover 12 which fits over the header and provides an enclosure for the parts mounted on top of the header. The enclosure is sealed as by welding the flange 13 of the cover to the flange 14 of the header. Four conductive leads extend up through the body of the header 11, and these leads project from the top of the header providing terminal posts 16', 17', 18' and 19'. The leads 16, 17, 18 and 19 are respectively the collector, base, emitter and ground leads for the transistor. The leads 16–18 are insulated from the conductive body of the header 11 by small insulator rings 15. The ground or shield lead 19 is directly connected to the body of the header. The lead 19 may be connected to the underside of the header 11 such that it terminates at the header rather than extending through it as shown in FIG. 1.

A heat sink tab 21 is secured at one end to the collector post 16' and extends toward the center of the header 11. A semiconductor unit 22 in the form of a die is fused to the other end of the tab 21. The base and emitter portions of the unit 22 are respectively connected to the base post 17' and the emitter post 18' by two fine contact wires 23 and 24. The base and emitter contacts of the unit 22 are in the form of tiny strips 26 and 27 which can be seen more clearly in FIGS. 3G, 3H and 3I. These strips are sometimes referred to as stripes in the art. As shown in these latter views, the strips 26 and 27 are located on a projection 29 which is surrounded by a channel-like depression 28. The projection 29 includes the active base region and the active collector junction of the transistor.

The overall manufacturing process for producing the transistor of FIGS. 1 and 2 will be described with reference to FIG. 3, and then the vapor deposition and alloying steps (2 and 3) will be described in greater detail with reference to FIGS. 4–8 inclusive. FIG. 3A is a fragmentary view of a wafer 31 of P-type germanium. The wafer 31 is obtained from a larger single crystal of P-type germanium which is grown by zone melting or other standard techniques which form no part of the present invention. The grown crystal is cut into many slices, and the slices are further processed and then cut up into wafes or slabs 31 which are typically squares with dimensions of ⅜ of an inch on each side and .003 of an inch thick.

The first main step is processing the wafer 31 is to diffuse donor-type impurity material into the wafer so as to form a diffused junction within it as shown by the dotted line 32 in FIG. 3B. After the diffusion treatment (step 1), the wafer 31 has a diffused surface layer 33 of N-type conductivity and a substrate layer 34 of P-type conductivity, with the rectifying diffused junction 32 located between the two layers 33 and 34. The impurity material may diffuse into both sides of the wafer 31, but only one diffused layer is desired so the other one is removed, for instance by etching.

The diffusion is accomplished by contacting the P-type wafer 31 (FIG. 3A) with a vapor of donor-type impurity material such as antimony. Several wafers are placed in an oven, and gas such as hydrogen is passed through the oven. The gas flows first over metallic antimony which is heated to a temperature of 250°–350° C., and then flows over the wafers. In this way, the gas picks up a certain quantity of antimony vapor from the metallic antimony, and the antimony vapor contacts the wafers and diffuses into them. The wafers remain in the furnace for about 1 hour and are maintained at a temperature of about 650° C. during this time. Since the concentration of the diffused impurities in the wafer is highest at the surface of the wafer, the resistivity of the diffused layer 33 is graded from a relatively low value immediately adjacent the surface to a relatively high value adjacent the junction 32. Typically, the diffusion step as described produces a diffused layer with a thickness of about 10,000 Angstrom units.

In step 2 of the process, materials are vapor deposited onto the diffused wafer 31 of FIG. 3B so as to form the pairs of emitter and base contacts 26 and 27 on the wafer as shown in FIG. 3C. The appearance of the wafer after the vapor deposition step is shown in FIG. 6. Many pairs of the contacts 26 and 27 are provided on a single wafer 31, and as a typical example, 144 pairs of the contacts are deposited on a single wafer. The manner in which the contacts 26 and 27 are deposited will be described more fully in connection with FIGS. 4–7.

In step 3 of FIG. 3 the contacts 26 and 27 are alloyed with the germanium of the wafer 31. This is accomplished by placing the wafer in an alloying furnace such as that shown in FIG. 9, and heating the wafer to an elevated temperature. Upon cooling, the alloyed material from the deposits 27 recrystallizes and forms rectifying junctions slightly below the upper surface of the wafer, and these serve as the emitter junctions of the semiconductor units which are eventually obtained from the wafer 31. The material of the deposits 27 which remains undissolved after the alloying serves as the emitter electrode or contact of the semiconductor unit. Material from the deposits 26 alloys with the germanium of the wafer 31, but no rectifying junction is formed. The undissolved material of the deposits 26 serve as the base electrode or contact of a semiconductor unit.

Step 4 is the vapor deposition of a contact film 36 on the substrate layer 34 as shown in FIG. 3E. The film 36 is formed by placing the wafer in a standard vacuum evaporator, and depositing three metallic layers on the substrate 34. The first layer is gold, the second layer is gold and indium and the third layer is gold. The film 36 makes what is known as a non-injecting contact with the substrate layer 34, and upon division of the wafer the film 36 serves as the collector contact for the die units obtained from the wafer.

In step 5 of the process, the wafer 31 of FIG. 3E is divided so as to provide the die units as shown in FIG. 3F. The wafer 31 is scribed along parallel lines as shown by the shallow indentations 37 in FIG. 3E, and is broken into dice 22 which are typically about 0.025 inch square. The die units 22 have the contacts 26 and 27 centered on their upper surface, and a contact film 36 on their bottom surface as viewed in FIG. 3F.

Step 6 is the mounting or assembly of a die unit 22 on the header 11 which has previously been provided as a subassembly, and the resulting structure is shown schematically in FIG. 3G. The mounting tab 21 has a thin layer of gold on the upper side, and this layer contacts the gold-indium material 36 previously deposited on the substrate layer of the die unit 22. The assembly is heated to a temperature of about 400° C. in a hydrogen atmosphere, and this causes the gold and indium materials to alloy with the germanium and molybdenum such that upon cooling the die unit 22 is securely fastened to the tab 21 and there is good electrical contact between the tab and the unit 22. The purpose of the indium included in the film 36 is to inhibit the injection of electrons into the unit 22.

The assembly 11 with the die unit 22 on it is then etched (step 7) so as to form a channel-like depression 28 which extends around the contacts 26 and 27 as shown schematically in FIG. 3H. The purpose of the depression is to isolate the central portion 29 of the diffused layer of unit 22 from the remainder of the diffused layer. This central portion 29 then becomes the active base region and the active collector junction of the semiconductor unit. The etching is accomplished by a jet etching machine which applies etching liquid called electrolyte only to the peripheral area surrounding the central region 29, and current passes through the electrolyte causing it to remove material from this peripheral area so as to form the depression 28.

In step 8, the contact wires 23 and 24 are bonded to the respective contacts and posts as shown schematically in FIG. 3I. The wire 23 extends from the base contact 26 to the terminal post 17′, and the wire 24 extends from the emitter contact 27 to the terminal post 18′. These wires are very tiny filaments of gold, and they are bonded to the contacts and terminal posts by thermo-compression. The bonding is accomplished in a machine in which a bonding point presses the wires 23 and 24 against the strips and posts.

After the bonding operation, the header assembly 11 is baked in a vacuum at a temperature of 200°–300° C. in order to stabilize the properties of the device, and the cover 12 is then welded onto the body of the header 11 (see FIGS. 1 and 2). During step 9, the space within the enclosure provided by the cover 12 and the header 11 is filled with protective gas such as a mixture of helium and oxygen.

Figures 4, 5:
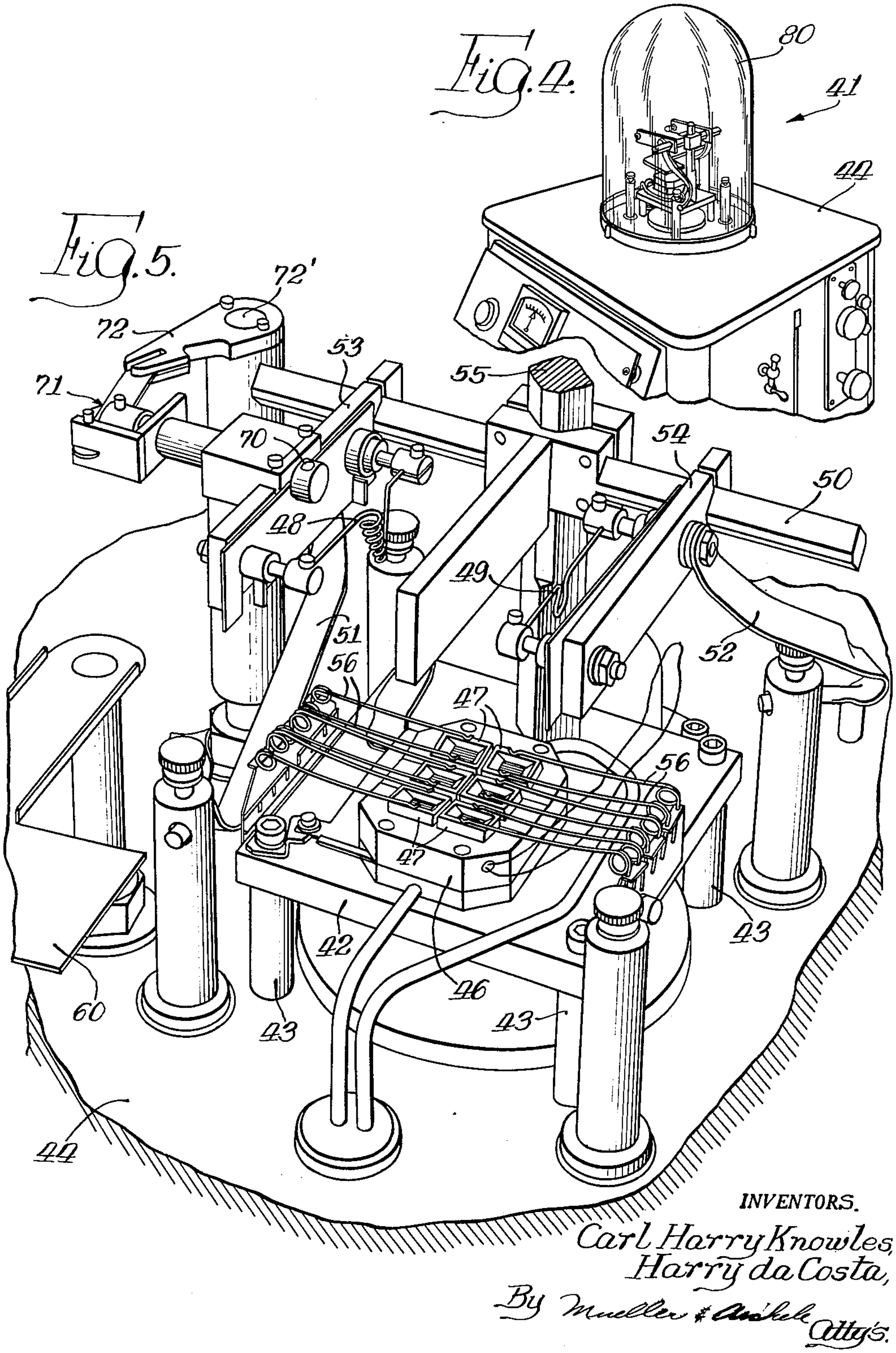
FIG. 4 is a perspective view of vacuum evaporator apparatus employed in the vapor deposition step of the process of FIG. 3.
FIG. 5 is an enlarged perspective view of that part of the apparatus of FIG. 4 within the vacuum chamber.

Steps 2 and 3 of the process (FIG. 3) will be described in greater detail with reference to FIGS. 4 to 9 inclusive. FIGS. 4 and 5 show the vacuum evaporator apparatus 41 which is employed for the deposition of the contacts 26 and 27 on the wafer 31. The apparatus includes a platform 42 supported on four upright posts 43 which are anchored to a base 44 which may be a table top as shown in FIG. 4. A heated platen structure 46 is mounted on the platform 42, and the structure 46 has six individual fixture assemblies 47 constructed to receive six of the wafers 31. The apparatus 41 also includes a pair of vaporizing filaments 48 and 49 supported on arms 53 and 54 attached to a crossarm 50 which is mounted on a vertical post 55. The filaments 48 and 49 are located in different positions with respect to the fixture assemblies 47 such that material vaporized from one filament will follow a different path in traveling to the wafers than material vaporized from the other filament. The filament 48 has the shape of a coil which serves as a basket for receiving the material to be vaporized. The filament 49 is U-shaped so that the material to be vaporized may be supplied as a piece of bent wire which can be easily hooked onto the filament as shown in FIG. 8. The vaporizing filaments 48 and 49 are heated by current supplied thereto by electrical connectors 51 and 52. Current is also supplied to a heating element which heats a surface in the structure 46 on which the wafers are received, and this heat maintains the wafers at a desired temperature. The various elements of the fixture assemblies are held in place by spring clips 56. A shield 60 may be rotated to a position over the structure 46 and serves to prevent vapor from reaching the assemblies 47 when this is desired.

The elements of the fixture assemblies 47 are shown in exploded relation in FIG. 7. Each assembly includes a frame 57 having an opening 58 of the same size and shape as the wafer 31. The wafer 31 fits into the opening 58 and rests on the heated element 59 which is made of molybdenum. A spacer plate 61 preferably of molybdenum is placed on top of the wafer 31, and the plate 61 has openings through it at the places where the contacts 26 and 27 are to be deposited. A mask 62 made of nickel is placed on top of the spacer, and the mask has a plurality of openings through it in the form of fine slits. These slits are typically about 1 to 1½ mils wide and 2 to 12 mils long and they define the position, area and configuration of the contacts 26 and 27 as will be explained. A grid 63 which fits over the mask 62 has several spaced cross pieces which permit the vapor to reach the wafer 31. A weight 64 fits over the grid 63 and holds the assembled parts in proper registry, and the springs 56 (see FIG. 5) contact the weight 64 supplying additional pressure.

The fixture assemblies are arranged in pairs as shown in FIG. 5, and the middle pair of fixtures is supported in a horizontal position whereas the two outer pairs are supported at an angle of about ten degrees with respect to horizontal. Material which is vaporized from the filaments 48 and 49 in vacuum conditions travels in substantially straight paths. The angle at which the outer pairs of fixtures are supported is selected so that the paths from the filament 48 to the fixtures 47 have nearly the same angle of incidence at each fixture, and likewise the paths from the filament 49 have nearly the same angle of incidence at each fixture. This provides uniformity of the deposits on the wafers in regard to their area, spacing and configuration.

Before an evaporation operation is carried out, the elements of the fixture assemblies 47 are baked under vacuum in order to outgas the parts. Then the fixtures 47 are assembled in the order shown in FIG. 8 with each fixture having a wafer 31 in it. The supporting arms 53 and 54 for the filaments 48 and 49 are movable along the crossarm 50 (see FIG. 5), and they are adjusted to the proper positions and set in place. The positions for the filaments are determined from data collected from past runs. A small piece of aluminum wire 66 (see FIG. 8) is placed on the U-shaped filament 49, and a piece of gold wire containing a trace of antimony 67 is placed in the basket filament 48. A coil 68 of pure silver wire having a straight piece of gold wire 69 extending through it as shown in FIG. 8 is mounted in an opening 70 in the positioning mechanism 71 (see FIG. 5). The mechanism 71 is actuated by a lever 72 secured to a spindle 72′, and the spindle is rotated by a control provided outside the evaporator. The assembly 68—69 is dropped into the basket 48 after the wire 67 has been evaporated as will be described further. The following dimensions are given for the wires 66–69 by way of example.

Wire 66—4 inches of 0.025 inch diameter wire of 99.999% pure aluminum.

Wire 67—¼ inch of 0.025 inch diameter wire of 99.5% gold and 0.5% antimony alloy material.

Wire 68—2½ inches of 0.025 inch diameter wire of pure silver.

Wire 69—1 inch of 0.025 inch diameter wire of 99.999% pure gold.

After the metals to be vaporized have been put in place as described above, the apparatus 41 is covered with a bell jar 80 to provide a vacuum chamber (see FIG. 4), and a pump (not shown) is actuated so as to evacuate the interior of the chamber. Referring to FIG. 8, the filament 48 is energized briefly so as to pre-melt the wire 67 such that it forms a ball or droplet at the base of the basket 48. The wafers 31 are then heated and stabilized at a constant temperature by energizing the heating element which supplies heat to the support 59 and stabilizing the heater at a temperature of 300° C. as determined by a thermocouple. The filament 49 is then energized and the aluminum wire 66 is entirely evaporated.

Some of the vapor from the wire 66 travels along a path 73 represented by dotted lines and passes through the mask opening 74 at an angle of the order of 60–70° with respect to the surface of the wafer 31. The aluminum vapor deposits on the wafer 31 in the form of a strip 27, and a similar strip is formed on each of the portions of the wafer 31 exposed by the openings in the mask 62. The angle at which aluminum vapor material passes through the mask openings is substantially the same for each of the six wafers processed at one time because of the angular positioning of the outer pairs of fixtures as explained above.

After the aluminum has been deposited to form the strips 27, the heater is maintained at a temperature of about 300° C., and the gold and antimony alloy material of the wire 67 is evaporated from the filament 48. Some of the gold and antimony vapor material travels along the path indicated by the dotted lines 75 and passes through the mask openings 74 at an angle of the order of 100–120° with respect to the surface of the wafer 31. This angle is the same at each mask opening as pointed out above. The gold and antimony deposits on the wafer 31 forming the strip 26, and one of these strips is formed on the wafer at each of the portions exposed by the mask openings. After the gold and antimony material is all deposited, the assembly 68—69 is dropped into the basket 48, and all of the gold and silver material of the assembly is evaporated. This gold and silver vapor deposits on top of the gold-antimony. The two strips 26 and 27 are closely spaced from each other, and for example, may be located about one-half mil apart. The dimensions of the strips depend upon the size of the openings 74. Typical dimensions for the strips and openings are 1 x 2 mils, 1 x 6 mils and 1.5 x 12 mils. In some cases more than two strips are provided for each die unit, and in one example (not shown) there is one emitter strip and a base strip on each side of the emitter. Also, it is not essential to make the contacts in the form of strips, and contacts of other configurations may be formed by suitable modification of the shape of the mask openings. The order in which the contacts are deposited is not critical.

The wafers are then cooled down, the vacuum is broken, and the bell jar 80 is removed. The fixtures 47 are disassembled and the wafers 31 are removed from the evaporator 41. FIG. 6 is a greatly enlarged view of a wafer 31 which shows the condition of the wafer as it comes out of the evaporator. It can be seen that there are a plurality of pairs of strip-like contacts 26 and 27 on the surface of the wafer arranged in rows. The strip-like contacts are accurately defined as to area, position and configuration by the vapor-deposition and masking process, and the six wafers processed at one time are sufficiently uniform to maintain desirable uniformity in the completed transistor units insofar as the contacts 26 and 27 are concerned.

Several of the wafers 31 are alloyed at one time (step 3) in an alloying furnace 81 such as is shown in FIG. 9. The furnace 81 consists of an insulated enclosure 82 and a quartz tube 83 which extends through the enclosure and projects from at least one end of the enclosure. The tube 83 is closed at its ends by caps 84 which are removable. A flow of gas through the tube 83 is provided as indicated by the arrows in FIG. 9. The interior of the furnace 81 is heated as by an electrical heating coil 86. The wafers 31 are carried on a boat 87 which may be made of quartz, and the boat 87 is pushed into and pulled out of the furnace within the tube 83 by means of a rod which is not shown in FIG. 9. A thermocouple element 88 is attached to the boat 87 for monitoring the temperature within the furnace.

In a typical example, six of the wafers 31 are loaded onto the boat 87, and the boat is then placed in the cool zone of the tube 33 outside the enclosure 82. The cap 84 is then placed on the tube, and a flow of gas such as nitrogen is established through the tube. The boat is then pushed into the hot zone of the furnace to a position as shown in FIG. 9 at which the temperature is maintained at 440° C. plus or minus 2½° C. The boat is allowed to remain in this hot temperature zone for five minutes after the temperature reaches 440° C. as measured by the thermocouple, and then is pulled back to the cool zone until the temperature drops below 70° C. Then the boat is removed from the furnace, and the wafers or slabs 31 are unloaded. When the wafers are heated in this controlled manner, the contacts 26 and 27 alloy with the wafer, and the penetration of the alloy regions is very shallow, being less than the thickness of the diffused layer. It has been found that by heating the wafers in an alloying furnace for a predetermined time after both emitter and base contacts are deposited, the penetration of the alloy regions can be controlled accurately. The penetration is limited to a depth less than the thickness of the diffused layer, and the number of rejects caused by shorting through the diffused layer is minimized.

During the alloying operation carried out in the furnace 81, aluminum from each of the contacts 27 alloys with the germanium of the wafers and the alloy recrystallizes upon cooling forming a highly doped P-type region which provides an emitter junction for the adjacent N-type base region. The contacts 26 do not form junctions. Upon heating, the gold-antimony material of each strip 26 forms a melt which dissolves germanium. The gold, antimony and germanium melt then dissolves some of the silver which has been deposited on top of the gold-antimony material. Upon cooling, the alloy recrystallizes and provides an ohmic contact with a higher melting point than could be obtained with gold alone alloyed with the germanium. Enough silver remains undissolved to provide the base contact or electrode, and the gold which is mixed with this silver colors the contact so that it is easily distinguishable from the aluminum strip 27 when viewed under a microscope, and also prevents growth of whiskers on the silver.

Several evaporation and alloying runs can be made in a normal working day, and since several wafers are treated in each run, the output from the evaporation and alloying operations is quite high. The net output of mechanically and electrically satisfactory units is many times higher than has heretofore been possible in a mass production operation. Accordingly, the invention provides an economical method for fabricating the wafers and die units with significantly improved yields of acceptable units.

We claim:

A method of making die units for semiconductor devices from semiconductor crystal elements having a thin diffused layer at one face thereof, said method including the steps of placing a plurality of such crystal elements on a heating structure in a vacuum evaporator apparatus with said diffused layers of said elements facing first and second vaporizing means located at different positions in said apparatus, positioning said crystal elements angularly with respect to each other on said heating structure so that each said crystal element is in a position to receive vapor from said first vaporizing means at substantially the same angle of incidence and to receive vapor from said second vaporizing means at another angle of incidence which is substantially the same for each element, positioning a plurality of masks respectively at said crystal elements so that each mask is adjacent to but spaced from the diffused layer of the corresponding crystal element, with said masks each having a plurality of contact-defining openings therein located respectively at die unit areas of said elements, vaporizing rectifying-junction-forming impurity material and ohmic-contact-forming metallic material respectively from said first and second vaporizing means in vacuum conditions in a selected sequence while maintaining said masks and said crystal elements stationary and heating said crystal elements at a constant temperature by means of said heating structure so as to project said materials through the same openings in said masks but with one material passing through the openings at a different angle from the other, thus forming a metallic deposit and an impurity deposit on respective portions of each die unit area of said elements, removing said crystal elements from said vacuum evaporator apparatus, subsequently placing each said crystal element in an alloying apparatus and in a heated zone thereof maintained at a constant temperature sufficient to cause alloying of said deposits with said crystal element to a depth therein less than the thickness of said diffused layer, and dividing said crystal elements into die units each having an alloyed impurity deposit thereon forming a rectifying contact and an alloyed metallic deposit thereon forming an ohmic contact.

References Cited in the file of this patent

UNITED STATES PATENTS

| | | |
|---|---|---|
| 2,666,814 | Shockley | Jan. 19, 1954 |
| 2,695,852 | Sparks | Nov. 30, 1954 |
| 2,793,332 | Alexander et al. | May 21, 1957 |
| 2,815,462 | Auphan | Dec. 3, 1957 |
| 2,845,894 | McIlvaine | Aug. 5, 1958 |
| 2,879,188 | Strull | Mar. 24, 1959 |
| 2,906,637 | Auphan | Sept. 29, 1959 |
| 2,909,453 | Lasco et al. | Oct. 20, 1959 |
| 2,929,750 | Strull et al. | Mar. 20, 1960 |
| 2,944,321 | Westberg | July 12, 1960 |
| 2,969,296 | Walsh | Jan. 24, 1961 |
| 2,995,475 | Sharpless | Aug. 8, 1961 |
| 3,018,539 | Taylor et al. | Jan. 30, 1962 |